United States Patent
Tang et al.

(10) Patent No.: US 10,766,784 B2
(45) Date of Patent: Sep. 8, 2020

(54) METHOD OF MANUFACTURING SEMICONDUCTOR MATERIAL FROM MAYENITE

(71) Applicant: Wuhan University, Wuhan (CN)

(72) Inventors: Shengwen Tang, Wuhan (CN); Wenzhi Yu, Wuhan (CN); Wei Zhou, Wuhan (CN); Yang Li, Wuhan (CN); Hubao A, Wuhan (CN)

(73) Assignee: WUHAN UNIVERSITY, Wuhan (CN)

( * ) Notice: Subject to any disclaimer, the term of this patent is extended or adjusted under 35 U.S.C. 154(b) by 100 days.

(21) Appl. No.: 16/232,033

(22) Filed: Dec. 25, 2018

(65) Prior Publication Data

US 2020/0062606 A1 Feb. 27, 2020

(30) Foreign Application Priority Data

Aug. 22, 2018 (CN) ............ 2018 1 0958973

(51) Int. Cl.
| | |
|---|---|
| *C01F 17/00* | (2020.01) |
| *C01F 7/16* | (2006.01) |
| *C30B 13/34* | (2006.01) |
| *C30B 15/36* | (2006.01) |
| *C30B 29/20* | (2006.01) |

(52) U.S. Cl.
CPC .............. *C01F 7/164* (2013.01); *C30B 13/34* (2013.01); *C30B 15/36* (2013.01); *C30B 29/20* (2013.01); *C01P 2002/72* (2013.01); *C01P 2004/02* (2013.01); *C01P 2004/03* (2013.01); *C01P 2004/80* (2013.01); *C01P 2006/40* (2013.01)

(58) Field of Classification Search
CPC ......... C01F 7/164; C30B 13/34; C30B 15/36; C30B 29/20
USPC ........................................ 423/600
See application file for complete search history.

(56) References Cited

U.S. PATENT DOCUMENTS

2015/0184282 A1* 7/2015 Ito .............. C01F 7/164
 264/614
2018/0044589 A1* 2/2018 Watanabe ................ A61Q 5/06

* cited by examiner

*Primary Examiner* — Steven J Bos
(74) *Attorney, Agent, or Firm* — Matthias Scholl P.C.; Matthias Scholl (57) ABSTRACT

A method of preparation of semiconductor material. The method includes: adding an organic substance containing a benzene ring and dodecacalcium hepta-aluminate ($12CaO \cdot 7Al_2O_3$ or C12A7) to a test tube, and sealing the test tube; heating the test tube to a temperature of 200-300° C., and holding the temperature for 1 to 3 hours; and continuously heating the test tube to a temperature of 900-1300° C., and holding the temperature for 10-120 hours.

11 Claims, 9 Drawing Sheets

METHOD OF MANUFACTURING SEMICONDUCTOR MATERIAL FROM MAYENITE

CROSS-REFERENCE TO RELATED APPLICATIONS

Pursuant to 35 U.S.C. § 119 and the Paris Convention Treaty, this application claims foreign priority to Chinese Patent Application No. 201810958973.4 filed Aug. 22, 2018, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure relates to the field of inorganic material technology, and more particularly to a preparation method of a semiconductor material from mayenite.

Dodecacalcium hepta-aluminate ($12CaO.7Al_2O_3$ or $Ca_{12}Al_{14}O_{33}$, hereinafter referred to as C12A7) exists in the form of porous ceramic crystals and belongs to the mayenite group of oxide minerals. Extant studies used a variety of methods, such as redox reaction and ion implantation, to replace $O^{2-}$ ions in the C12A7 to obtain a series of C12A7 derivatives C12A7: $M^-$ (where $M^-$ denotes a negative ion such as $H^-$, $O_2^-$, $OH^-$, $Cl^-$, $F^-$ and $e^-$). C12A7: $e^-$ corresponds to a derivative wherein electrical properties are formed by the electron substitution of $O^{2-}$ in C12A7.

In recent years, attempts have been made to improve the conductivity of C12A7. However, they were based on monocrystallineline C12A7, which is difficult to prepare. Although C12A7 polycrystalline conductive material can be prepared via calcination with $11CaO.7Al_2O_3$+Ca as materials, the preparation procedure is complex, difficult to control, and costly.

SUMMARY

The disclosure provides an improved preparation method for C12A7 conductive material.

Disclosed is a method of manufacturing a semiconductor material, the method comprising:
(1) adding an organic substance containing a benzene ring and dodecacalcium hepta-aluminate ($12CaO.7Al_2O_3$ or C12A7) to a test tube, and sealing the test tube;
(2) heating the test tube to a temperature of 200-300° C., and holding the temperature for 1 to 3 hours; and
(3) continuously heating the test tube to a temperature of 900-1300° C., and holding the temperature for 10-120 hours.

The dodecacalcium hepta-aluminate can be a monocrystalline or polycrystalline material. The polycrystalline material of the dodecacalcium hepta-aluminate can be prepared as follows:
(1.1) weighing calcium nitrate tetrahydrate and aluminum nitrate nonahydrate according to a stoichiometric ratio thereof of 12 to 14; weighing urea which is three times a total stoichiometry of the calcium nitrate tetrahydrate and the aluminum nitrate nonahydrate, mixing and stirring the calcium nitrate tetrahydrate, the aluminum nitrate nonahydrate, and the urea with deionized water, to form a transparent solution;
(1.2) transferring the transparent solution to a corundum crucible, heating a muffle furnace to 500° C., calcining the corundum crucible in the muffle furnace for 2 hours, and cooling the muffle furnace, to yield polycrystalline C12A7 powders; and
(1.3) pressing the polycrystalline C12A7 powders into a tablet having a thickness of 0.5-0.8 mm under a pressure of 100-200 megapascal The monocrystalline material of the dodecacalcium hepta-aluminate can be prepared using a floating zone (FZ) method or Czochralski (CZ) method, and the Czochralski (CZ) method can comprise:
dissolving a polycrystalline C12A7 in a crystal grower, using platinum wire as a seed crystal and pulling out a crystal, allowing the crystal to grow, and cooling the crystal to room temperature in 30 to 50 hours to obtain a C12A7 monocrystalline block; and
cutting the monocrystalline block into sheets having a thickness of about 0.8 mm.

The method can further comprise degreasing and dehydroxylating the dodecacalcium hepta-aluminate prior to (1). The degreasing and dehydroxylating the dodecacalcium hepta-aluminate can comprise: heating the dodecacalcium hepta-aluminate to a temperature of 1100° C., holding the temperature for 15 hours, and cooling.

The calcium (Ca) and aluminum (Al) in the dodecacalcium hepta-aluminate can be partially substituted by iron (Fe), magnesium (Mg) or rare-earth metal elements; the rare-earth metal elements can be selected from europium (Eu), dysprosium (Dy), erbium (Er), holmium (Ho), and ytterbium (Yb), and a substitution ratio is 0 to 5% by mole; and the anion $O^{2-}$ in the dodecacalcium hepta-aluminate can be replaced by $H^-$, $O^-$, $OH^-$ or halogen ions, and the halogen ions can be $F^-$ or $Cl^-$.

The weight ratio of the organic substance containing a benzene ring to the dodecacalcium hepta-aluminate in the test tube can be between 10:1 and 1:50. The test tube can be a quartz test tube, a corundum test tube or a ceramic test tube, and the test tube is provided with a stopper.

The organic substance containing a benzene ring can be chlorobenzene, o-dichlorobenzene, bromobenzene, benzoic acid, phthalic acid, benzaldehyde, benzonitrile, anisole, benzenesulfonic acid, acetophenone, phenylacetamide, methyl benzoate, phenol, styrene, aniline, p-phenylenediamine, or a mixture thereof.

The purity of the organic substance containing a benzene ring can be not lower than an industrial grade.

In certain embodiments of the disclosure, the organic substance containing a benzene ring is decomposed to yield $C_4H_2$, $C_4H_3$, $C_6H_2$, $C_8H_2$, CO, $H_2$, and carbon at high temperatures of 900-1300° C., which can react with $O^{2-}$ in the material C12A7 to produce electrons. The benzene series are chemically stable and decomposed only at high temperatures. Thus, a combustion reaction occurs before decomposition, and a low amount of oxygen in the test tube is consumed. Furthermore, the decomposition temperature is essentially identical to the redox reaction temperature, and thus the decomposed products of benzene series participate in the reaction immediately and exhibit high utilization ratio. Additionally, the carbon produced via decomposition forms a carbon film around the mouth of the test tube and on the surface of C12A7 material, thus effectively preventing the intrusion of external oxygen. Extant studies report that hydrogen, metal calcium, metal titanium, and other reducing media are used. The materials exhibit high reactivity and lose their effectiveness extremely fast in the aerobic environment.

The method according to embodiments of the disclosure exhibits several advantages over prior technology. Benzene series includes several types of chemical substances that provide a variety of material selection opportunities to prepare C12A7 conductive materials. The benzene series is chemically stable and exhibits advantages including ease of storage and lack of destruction of the performance during the preparation operation. Benzene series are cheap, and a high amount of reaction medium is generated at high temperatures. The amount of benzene series is reduced to 2% of the mass of C12A7 material, and this is economical. Furthermore, it is not necessary to perform the preparation process at a high temperature in a high vacuum environment, and this reduces the requirements of the equipment and makes the operation process easy. Finally, the prepared mayenite material exhibits high electrical conductivity.

BRIEF DESCRIPTION OF THE DRAWINGS

FIG. 2 is a flow diagram of a method of manufacturing a semiconductor material as described in the disclosure. The first step is to prepare C12A7 polycrystalline and monocrystalline materials, as shown in F110. Generally, a polycrystalline C12A7 is prepared by self-propagating combustion method, and a monocrystalline C12A7 is prepared by Czochralski (CZ) method. The second step shown in F120 is the treatment of C12A7 material, in which the material is physically flaked. The third step shown in F130 is the treatment of C12A7 material with benzene series under high temperatures.

FIGS. 6A-6D are scanning electron microscope (SEM) images of a C12A7 conductive material as described in the disclosure; specifically, FIG. 6A, FIG. 6B, FIG. 6C, FIG. 6D are microscopic topography of materials at magnifications of 3000, 10000, 5000, and 10000.

Figure 1:
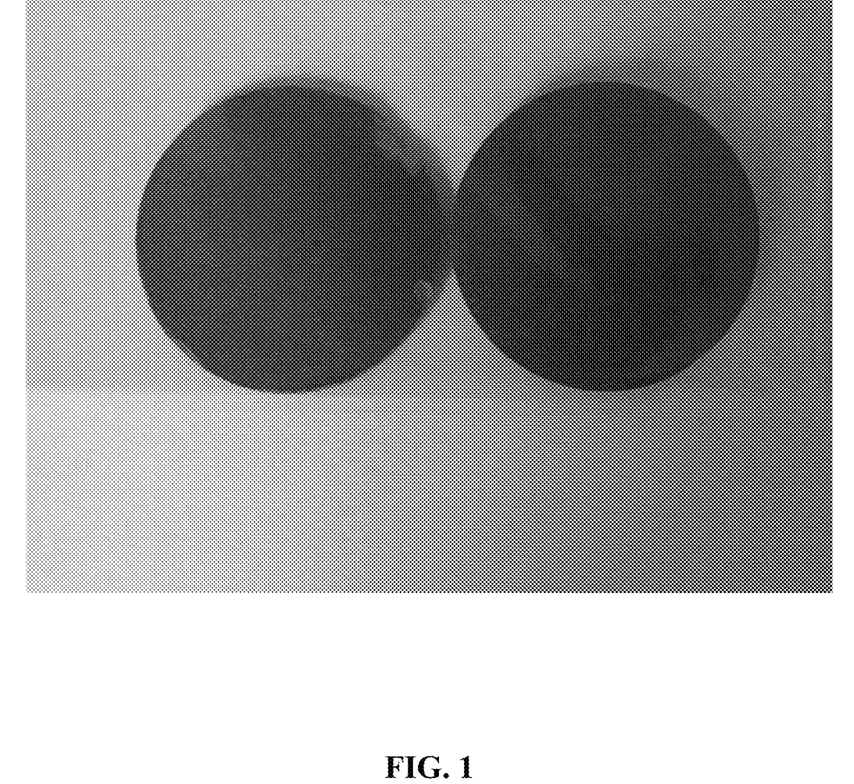
FIG. 1 is a photograph of a C12A7 conductive material as described in the disclosure.
Figure 2:
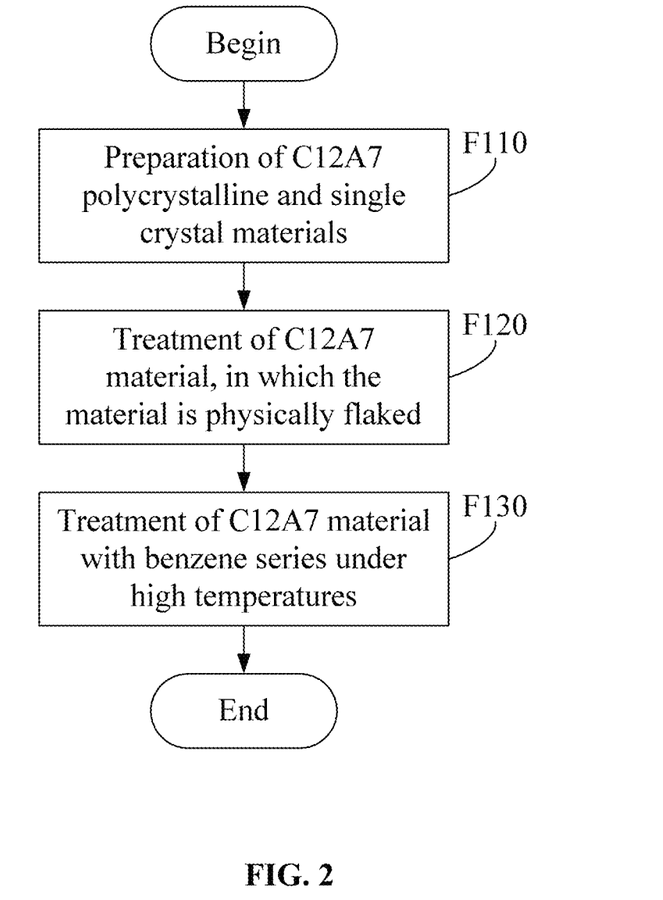
Figure 3:
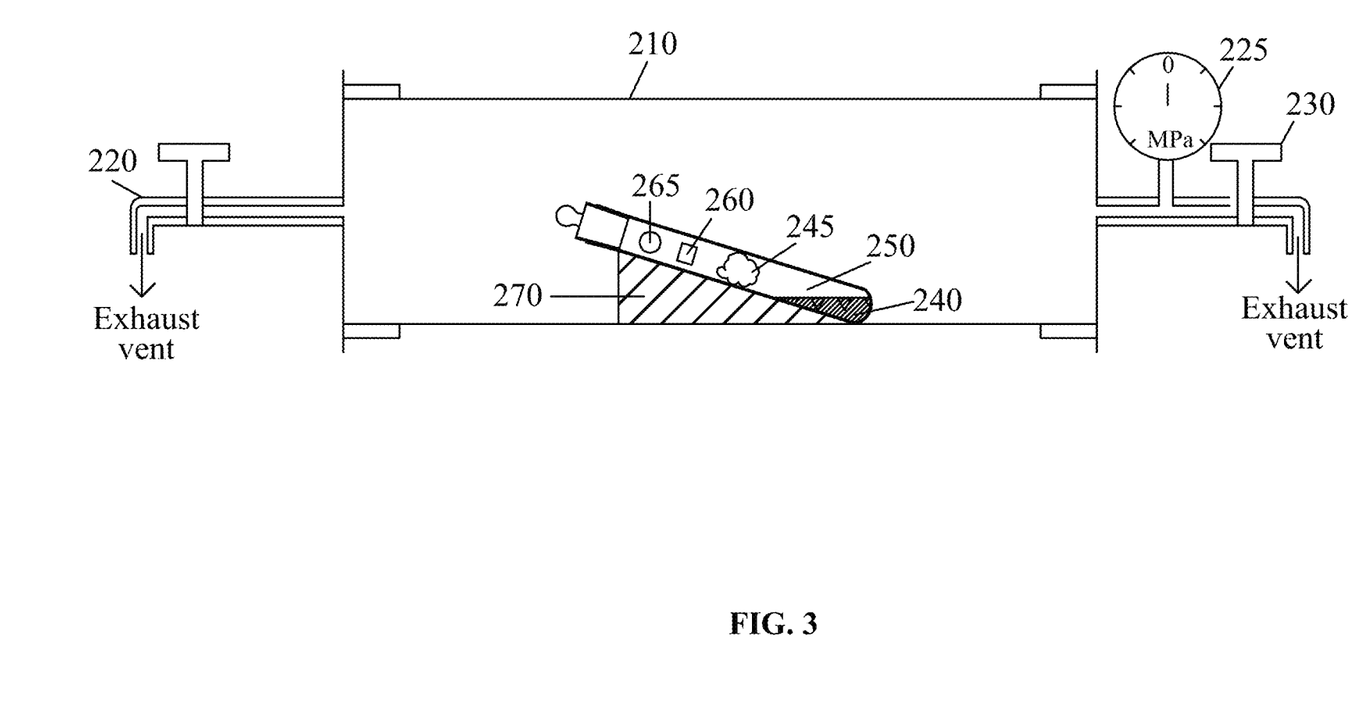
FIG. 3 is a schematic diagram of a device for manufacturing a semiconductor material as described in the disclosure.
Figure 4:
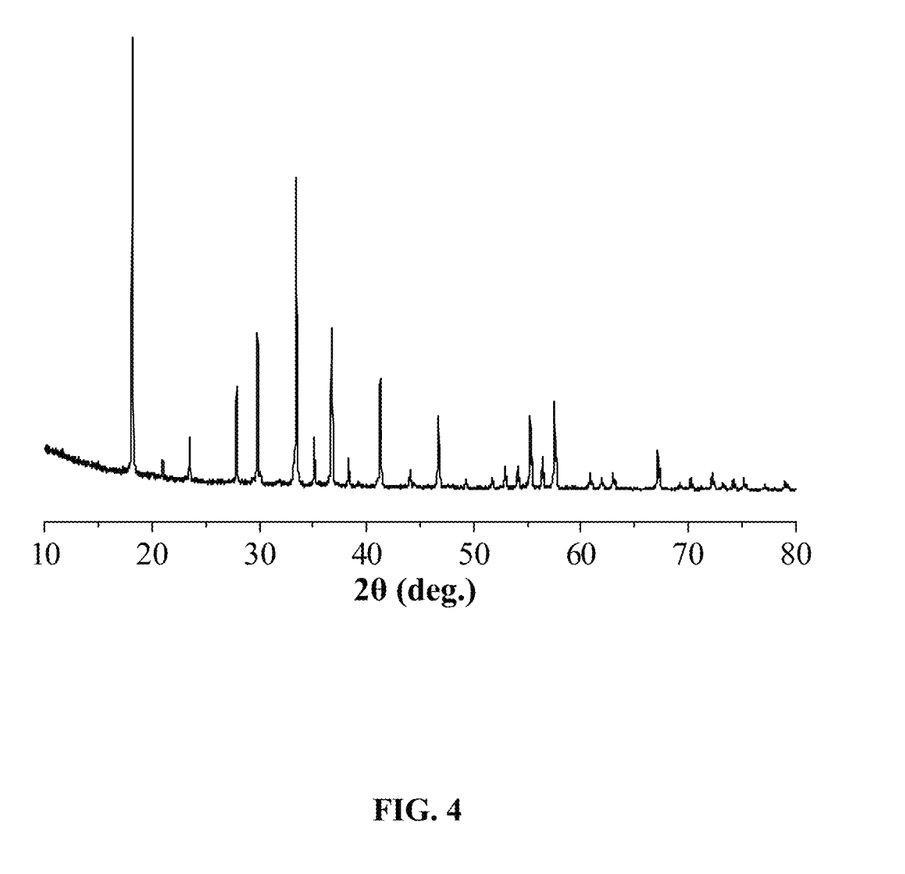
FIG. 4 is an X-ray diffraction pattern of a polycrystalline sample as described in the disclosure.
Figure 5:
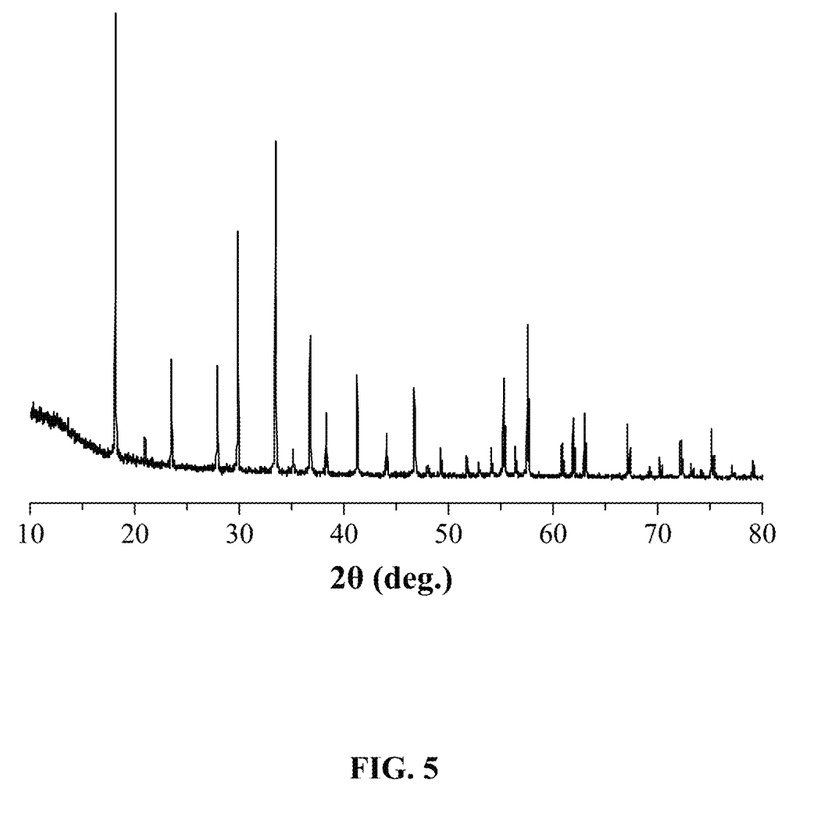
FIG. 5 is an X-ray diffraction pattern of a monocrystalline sample as described in the disclosure.
Figure 6A:
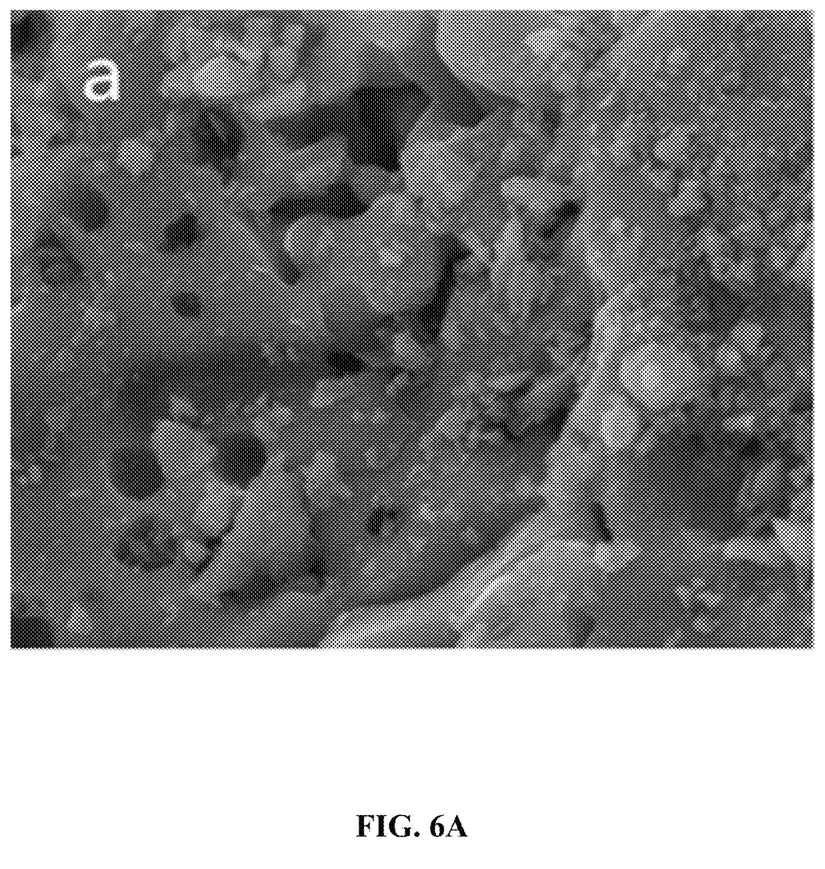
Figure 6B:
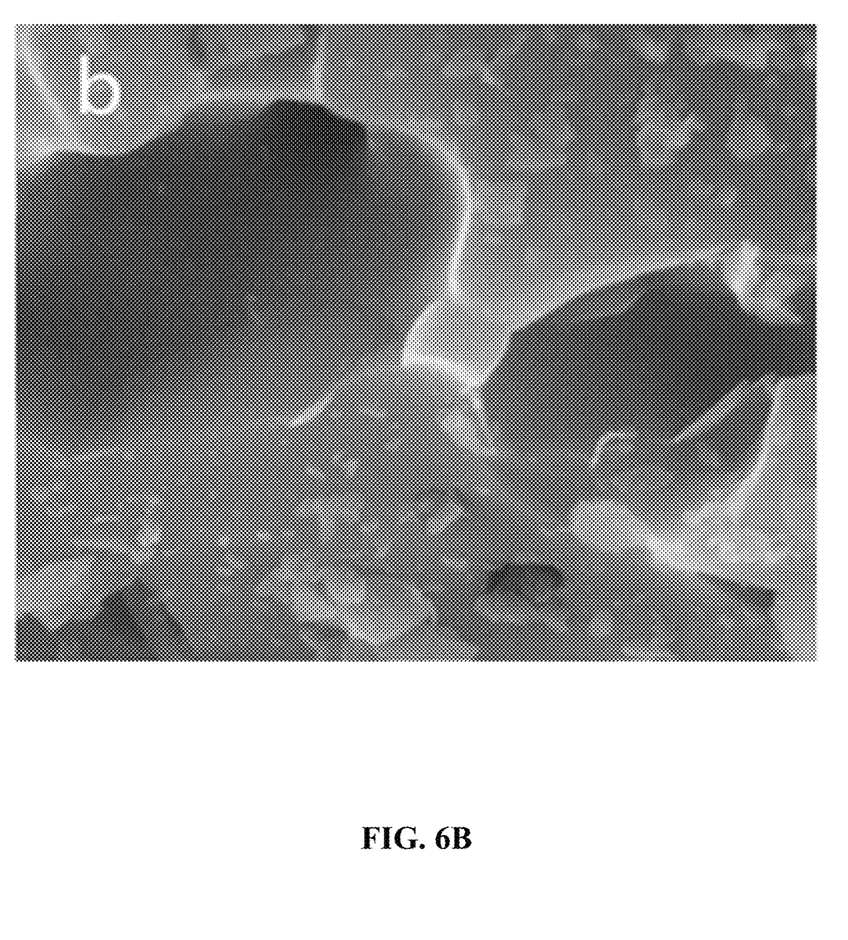
Figure 6C:
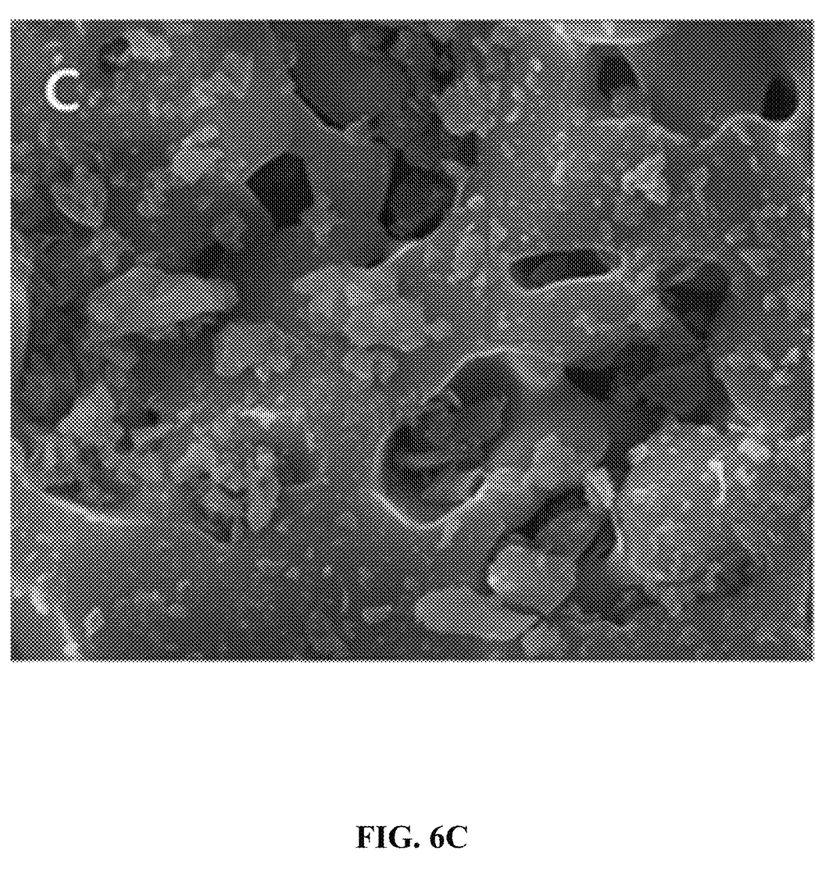
Figure 6D:
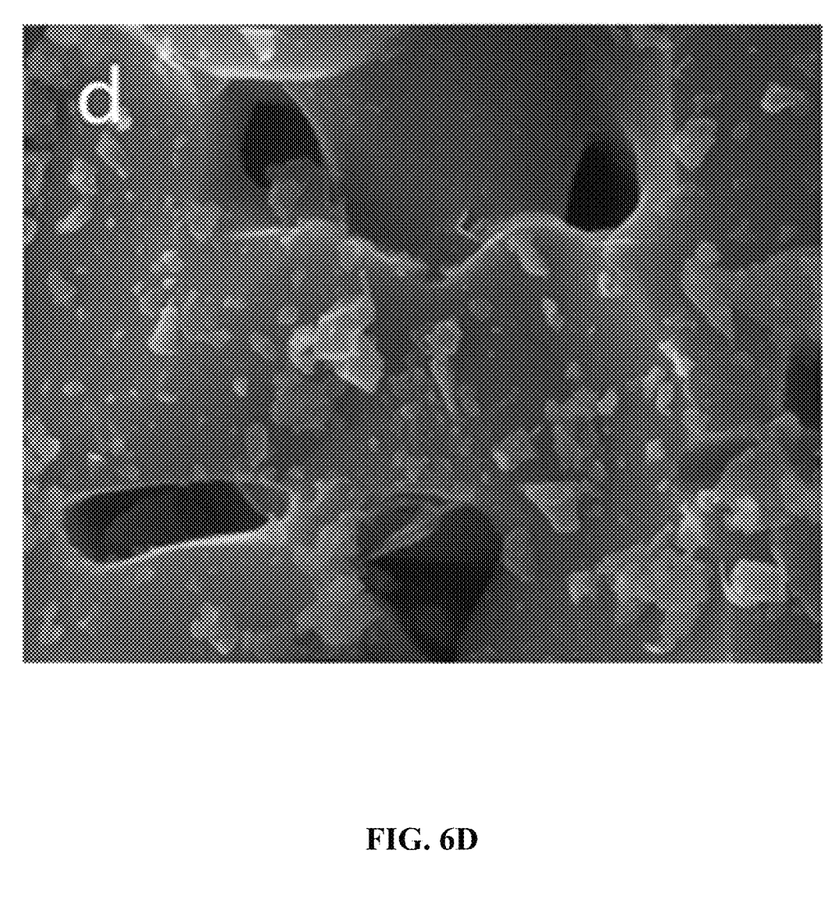

In the drawings, the following reference numbers are used: 210, the hearth of the furnace; 220, flange; 225, barometer; 230, twist switch; 240, benzene series; 250, test tube; 260, C12A7 monocrystalline slices; 265, C12A7 polycrystalline tablets; 245, high-temperature-resistant ceramic fiber cotton; 270, wedge-shaped base.

DETAILED DESCRIPTION

Example 1

A polycrystalline C12A7 semiconductor material is prepared as follows:

(1) 30.0 g of calcium nitrate tetrahydrate, 55.6 g of aluminum nitrate nonahydrate, 49.59 g of urea and 200 mL of distilled water were placed in a 500 mL glass beaker, and then the beaker was heated to 80° C. while stirring. The solution was transferred to the corundum, and thus, the volume of the solution in the crucible was less than half of its volume. When the furnace was heated to 500° C., the crucible was placed in the furnace and calcined in an air atmosphere for 2 h to obtain a fluffy white sample. This was ground to a powder and detected as a polycrystalline C12A7 material via X-ray diffraction (XRD).

(2) 0.2 g of C12A7 polycrystalline powder was placed in a mold with a diameter of 13 mm. The C12A7 tablets were formed under a pressure of 100 megapascal for 30 s. The tablets were then placed in a quartz test tube that was sealed and calcined at 1100° C. for 15 h to degrease and dehydroxylate the tablets.

(3) The water absorbent paper was stuffed at the bottom of the quartz tube so that it absorbed 5 mL of o-dichlorobenzene without the overflow phenomenon. A small mass of high-temperature cotton was inserted at the top of the absorbent paper, and two slices of dehydroxylated C12A7 tablets were placed on the cotton. After the plug was inserted, the tube head was raised with a corundum wedge and then placed in the middle of the furnace. The temperature of the furnace was increased to 300° C. at a rate of 10° C./min and heated for 1 h. Subsequently, the temperature was increased to 1100° C. at a rate of 5° C./min, and a black conductive C12A7 material was obtained by natural cooling to room temperature after heat preservation for 90 h.

FIG. 3 shows a schematic diagram of the device for manufacturing a type of semiconductor material of the present invention. Specifically, 240 denotes the benzene series; 250 denotes the test tube; 260 and 265 denote the C12A7 monocrystalline slices and polycrystalline tablets, respectively; 245 denotes high-temperature-resistant ceramic fiber cotton; 270 denotes a wedge-shaped base composed of ceramic or corundum material; 210 denotes the hearth of the furnace composed of corundum; 220 denotes the flange used to seal the furnace; 230 denotes the twist switch on the flange, through the exhaust vent interface on the flange (where opening switch 230 can pump out the gas in the furnace through a mechanical pump); and 225 denotes the barometer connected to the flange (and indicates the pressure inside the furnace).

Example 2

In a manner similar to the method in Example 1, C12A7 polycrystalline conductive material was manufactured. However, the C12A7 polycrystalline powder corresponds to an anion doped material prepared via the method of self-propagating combustion. The specific methods are as follows: 29.1 g of calcium nitrate tetrahydrate, 0.423 g of calcium chloride, 55.6 g of aluminum nitrate nonahydrate, 49.59 g of urea and 200 mL of distilled water were placed in a 500-mL glass beaker, and the beaker was then heated to 80° C. while stirring. The solution was transferred to the corundum, and thus, the volume of the solution in the crucible was less than half of its volume. When the furnace was heated to 500° C., the crucible was placed in a furnace and calcined in an air atmosphere for 2 h to obtain a fluffy white sample that was ground to a powder and identified via XRD as a polycrystalline C12A7 material.

Thus, a black conductive C12A7 material was obtained.

Example 3

In a manner similar to the method in Example 1, C12A7 polycrystalline conductive material was manufactured. However, the C12A7 polycrystalline powder corresponds to an ion doped material prepared via the method of self-propagating combustion. The specific methods are as follows: 28.80 g of calcium nitrate tetrahydrate, 2.28 g of ytterbium(I) nitrate pentahydrate, 55.60 g of aluminum nitrate nonahydrate, 49.59 g of urea and 200 mL of distilled water were placed in a 500-ml glass beaker, and the beaker was then heated to 80° C. while stirring. The solution was transferred to the corundum, and thus, the volume of the solution in the crucible was less than half of its volume. When the furnace was heated to 500° C., the crucible was placed in a furnace and calcined in an air atmosphere for 2 h to obtain a fluffy white sample that was ground to a powder and identified via XRD as a polycrystalline C12A7 material.

Thus, a black conductive C12A7 material was obtained.

Example 4

In a manner similar to the method in Example 1, C12A7 polycrystalline conductive material was manufactured. However, in (3), the benzene series corresponded to 3 g of benzenic acid, and the heat preservation time at 1100° C. was 100 h.

Thus, a black conductive C12A7 material was obtained.

Example 5

In a manner similar to the method in Example 1, C12A7 polycrystalline conductive material was manufactured. However, in (3), the benzene series corresponded to 5 g of benzenesulfonic acid, and the heat preservation time at 1100° C. was 60 h.

Thus, a black conductive C12A7 material was obtained.

Example 6

In a manner similar to the method in Example 1, C12A7 polycrystalline conductive material was manufactured. However, in (3), the benzene series was 2 g of p-phenylenediamine, and the heat preservation time at 1100° C. was 120 h.

Thus, a black conductive C12A7 material was obtained.

Example 7

A monocrystalline C12A7 semiconductor material is prepared as follows:

(1) The polycrystalline C12A7 prepared by Example 1 was added to the iridium crucible and compacted to exclude several air pores. The iridium crucible was placed in a double mullite insulation cover; thus, it was in the center of the insulation cover and coincided with the center of the iridium crucible. The furnace was subsequently sealed, and the gas in the furnace was evacuated until the degree of vacuum reached $10^{-3}$ Pa. The oxygen was inflated such that it occupied 0.5% of the volume content of the nitrogen and oxygen mixed gas, and the temperature was increased to 1200° C. to remove volatiles. Subsequently, the temperature was increased to 1400° C., and the powder was melted and heated for 2 h to ensure the uniformity of the melting solution. Subsequently, the temperature was decreased to 1390° C. to crystallize the C12A7 monocrystalline. The first preparation took platinum silk as the seed, and the crystal was pulled from the melt at a rate of 1.0-1.5 mm/h at a low speed of 10 to 20 rad/min. When the growth process was completed, the growing crystals were gradually cooled to room temperature within 30-50 h to avoid the formation of cracks due to thermal stress. The prepared material was identified via XRD as C12A7.

(2) Obtained bulk monocrystalline material were cut into slices with a thickness of 0.8 mm by using a diamond wheel saw. The monocrystalline slices were placed in a quartz tube, and the samples were then dehydroxylated by heating at 1100° C. for 15 h.

(3) A piece of absorbent paper was plugged into the bottom of the corundum test tube to absorb 5-mL bromobenzene without spillage. A small mass of high temperature cotton was inserted at the top of the absorbent paper, and two slices of dehydroxylated C12A7 tablets were placed on the cotton. After the plug was inserted, the tube head was raised with a corundum wedge and placed in the middle of the furnace. The temperature of the furnace was increased to 300° C. at a rate of 10° C./min and heated for 0.5 h. Subsequently, the temperature was increased to 1100° C. at a rate of 5° C./min. After heat preservation for 50 h, a black conductive C12A7 material was obtained via natural cooling to room temperature.

Example 8

In a manner similar to the method in Example 7, C12A7 monocrystalline conductive material was manufactured. However, the FZ method was adopted for the preparation of C12A7 monocrystalline. The specific methods are as follows: first, the polycrystalline C12A7 powder prepared by Example 1 was ground into fine powder. The powder was placed in a rubber tube and compressed under a hydrostatic pressure of 300 megapascal to form a rod shape and subsequently sintered at 1350° C. in an oxygen atmosphere for 24 h to obtain a semitransparent feed rod. An atmosphere of 2% $O_2$/98% $N_2$ was prepared with a gas flow rate of 100 mL/min. The rod with the seed of <100> crystal direction attached to the top surface was placed in the furnace, and the feed rod was placed such that its bottom was close to the seed. The halogen lamps were concentrated around the bottom of the feed rod. When the irradiated part of the rod was melted, the upper rod was pulled down and attached to the crystal. The feed and seed rods were counter-rotated at 10 rpm at a speed of 1.0 mm/h. The grown crystal was cut from the rod and slowly cooled to room temperature for 24 h.

Thus, a black conductive C12A7 material was obtained.

Example 9

In a manner similar to the method in Example 7, the monocrystalline C12A7 semiconductor material was manufactured. However, the polycrystalline C12A7 used to prepare the monocrystalline material via the CZ method in (1) corresponded to a material doped with halogen ions as prepared in Example 2.

Thus, a black conductive C12A7 material was obtained.

Example 10

In a manner similar to the method in Example 7, the monocrystalline C12A7 semiconductor material was manufactured. However, the polycrystalline C12A7 used to prepare the monocrystalline material via the CZ method in (1) corresponded to a material doped with rare earth metal ions as prepared in Example 3.

Thus, a black conductive C12A7 material was obtained.

Example 11

In a manner similar to the method in Example 8, the monocrystalline C12A7 semiconductor material was manufactured. However, the polycrystalline C12A7 used for preparing the monocrystalline material via the FZ method in (1) corresponded to a material doped with halogen ions prepared in Example 2.

Thus, a black conductive C12A7 material was obtained.

Example 12

In a manner similar to the method in Example 8, the monocrystalline C12A7 semiconductor material was manufactured. However, the polycrystalline C12A7 used to prepare the monocrystalline material via the FZ method in (1) corresponded to a material doped with rare earth metal ions as prepared in example 3.

Thus, a black conductive C12A7 material was obtained.

Example 13

In a manner similar to the method in Example 7, the monocrystalline C12A7 semiconductor material was manufactured. However, in (3), the benzene series corresponded to 3 mL of methyl benzoate, and the heat preservation time at 1000° C. was 90 h.

Thus, a black conductive C12A7 material was obtained.

Example 14

In a manner similar to the method in Example 7, the monocrystalline C12A7 semiconductor material was manufactured. However, in (3), the benzene series corresponded to 5 g of phenylacetamide, and the heat preservation time at 1100° C. was 120 h.

Thus, a black conductive C12A7 material was obtained.

The information on the type of benzene series, high-temperature treatment conditions, and electron density of the prepared product in the examples of the present invention are shown in Table 1, wherein the electron density is measured by the Hall Effect measurement system.

TABLE 1

Summary of information for the examples

| Example | Benzene series | Mass ratio of C12A7 to benzene series | Treatment temperature (° C.) | Treatment Time (h) | Electron density (cm$^{-3}$) |
|---|---|---|---|---|---|
| 1 | o-dichlorobenzene | 1:16 | 1100 | 90 | $7.3 \times 10^{19}$ |
| 2 | o-dichlorobenzene | 1:16 | 1100 | 90 | $6.9 \times 10^{19}$ |
| 3 | o-dichlorobenzene | 1:16 | 1100 | 90 | $7.2 \times 10^{19}$ |
| 4 | benzenic acid | 1:7.5 | 1100 | 100 | $5.7 \times 10^{19}$ |
| 5 | benzenesulfonic acid | 1:12.5 | 1100 | 60 | $4.3 \times 10^{19}$ |
| 6 | p-phenylenediamine | 1:5 | 1100 | 120 | $3.1 \times 10^{19}$ |
| 7 | bromobenzene | 1:19 | 1100 | 50 | $1.2 \times 10^{20}$ |
| 8 | bromobenzene | 1:19 | 1100 | 50 | $1.2 \times 10^{20}$ |
| 9 | bromobenzene | 1:19 | 1100 | 50 | $9.8 \times 10^{19}$ |
| 10 | bromobenzene | 1:19 | 1100 | 50 | $1.0 \times 10^{20}$ |
| 11 | bromobenzene | 1:19 | 1100 | 50 | $1.0 \times 10^{20}$ |
| 12 | bromobenzene | 1:19 | 1100 | 50 | $1.1 \times 10^{20}$ |
| 13 | methyl benzoate | 1:8 | 1000 | 90 | $9.3 \times 10^{19}$ |
| 14 | phenylacetamide | 1:5 | 1100 | 120 | $1.9 \times 10^{20}$ |

It will be obvious to those skilled in the art that changes and modifications may be made, and therefore, the aim in the appended claims is to cover all such changes and modifications.

What is claimed is:

1. A method, comprising:
   (1) adding an organic substance containing a benzene ring and dodecacalcium hepta-aluminate (C12A7) to a test tube, and sealing the test tube;
   (2) heating the test tube to a temperature of 200-300° C., and holding the temperature for 1 to 3 hours; and
   (3) continuously heating the test tube to a temperature of 900-1300° C., and holding the temperature for 10-120 hours.

2. The method of claim 1, wherein the dodecacalcium hepta-aluminate is a monocrystalline or polycrystalline material.

3. The method of claim 2, wherein the polycrystalline material of the dodecacalcium hepta-aluminate is prepared as follows:
   weighing calcium nitrate tetrahydrate and aluminum nitrate nonahydrate according to a stoichiometric ratio thereof of 12 to 14; weighing urea which is three times a total stoichiometry of the calcium nitrate tetrahydrate and the aluminum nitrate nonahydrate, mixing and stirring the calcium nitrate tetrahydrate, the aluminum nitrate nonahydrate, and the urea with deionized water, to form a transparent solution;
   transferring the transparent solution to a corundum crucible, heating a muffle furnace to 500° C., calcining the corundum crucible in the muffle furnace for 2 hours, and cooling the muffle furnace, to yield polycrystalline C12A7 powders; and
   pressing the polycrystalline C12A7 powders into a tablet having a thickness of 0.5-0.8 mm under a pressure of 100-200 megapascal.

4. The method of claim 2, wherein the monocrystalline material of the dodecacalcium hepta-aluminate is prepared using a floating zone (FZ) method or Czochralski (CZ) method, and the Czochralski (CZ) method comprises:
   dissolving a polycrystalline C12A7 in a crystal grower, using platinum wire as a seed crystal and pulling out a crystal, allowing the crystal to grow, and cooling the crystal to room temperature in 30 to 50 hours to obtain a C12A7 monocrystalline block; and
   cutting the monocrystalline block into sheets having a thickness of about 0.8 mm.

5. The method of claim 1, further comprising degreasing and dehydroxylating the dodecacalcium hepta-aluminate prior to (1).

6. The method of claim 5, wherein degreasing and dehydroxylating the dodecacalcium hepta-aluminate comprises: heating the dodecacalcium hepta-aluminate to a temperature of 1100° C., holding the temperature for 15 hours, and cooling.

7. The method of claim 1, wherein calcium (Ca) and aluminum (Al) in the dodecacalcium hepta-aluminate is partially substituted by iron (Fe), magnesium (Mg) or rare-earth metal elements; the rare-earth metal elements are selected from europium (Eu), dysprosium (Dy), erbium (Er), holmium (Ho), and ytterbium (Yb), and a substitution ratio is 0 to 5% by mole; and the anion $O^{2-}$ in the dodecacalcium hepta-aluminate is replaced by $H^-$, $O^-$, $OH^-$ or halogen ions, and the halogen ions are $F^-$ or $Cl^-$.

8. The method of claim 1, wherein a weight ratio of the organic substance containing a benzene ring to the dodecacalcium hepta-aluminate in the test tube is between 10:1 and 1:50.

9. The method of claim 1, wherein the test tube is a quartz test tube, a corundum test tube or a ceramic test tube, and the test tube is provided with a stopper.

10. The method of claim 1, wherein the organic substance containing a benzene ring is chlorobenzene, o-dichlorobenzene, bromobenzene, benzoic acid, phthalic acid, benzaldehyde, benzonitrile, anisole, benzenesulfonic acid, acetophenone, phenylacetamide, methyl benzoate, phenol, styrene, aniline, p-phenylenediamine, or a mixture thereof.

11. The method of claim 1, wherein a purity of the organic substance containing a benzene ring is not lower than an industrial grade.

\* \* \* \* \*